(12) United States Patent
Choi

(10) Patent No.: US 6,345,003 B1
(45) Date of Patent: Feb. 5, 2002

(54) REDUNDANCY CIRCUITS FOR INTEGRATED CIRCUIT MEMORY DEVICES INCLUDING REPAIR CONTROLLING CIRCUITS AND ENABLE CONTROLLING CIRCUITS

(75) Inventor: Hoon Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/350,639

(22) Filed: Jul. 9, 1999

(Under 37 CFR 1.47)

(30) Foreign Application Priority Data

Jul. 15, 1998 (KR) .................................................. 98-28662

(51) Int. Cl.[7] ....................................................... G11C 7/00
(52) U.S. Cl. .................. 365/200; 365/225.7; 365/230.06
(58) Field of Search ............................... 365/200, 225.7, 365/194, 230.06

(56) References Cited

U.S. PATENT DOCUMENTS

| 5,677,882 | * | 10/1997 | Isa et al. ................................ | 365/200 |
| 5,742,547 | | 4/1998 | Lee ........................................ | 365/200 |
| 5,761,138 | | 6/1998 | Lee et al. ............................... | 365/200 |
| 5,768,197 | * | 6/1998 | Choi ....................................... | 365/200 |
| 5,777,931 | | 7/1998 | Kwon et al. .......................... | 365/200 |
| 5,812,466 | * | 9/1998 | Lee et al. ............................... | 365/200 |
| 5,933,382 | * | 8/1999 | Yi et al. ................................. | 365/225.7 |
| 5,959,904 | * | 9/1999 | Oh .......................................... | 365/200 |
| 5,973,969 | * | 10/1997 | Matsuki ................................. | 365/200 |

* cited by examiner

Primary Examiner—Richard Elms
Assistant Examiner—Hien Nguyen
(74) Attorney, Agent, or Firm—Myers Bigel Sibley & Sajovec

(57) ABSTRACT

Integrated circuit memory device redundancy circuits include a plurality of field effect transistors and fuses, a respective field effect transistor and a respective fuse being serially coupled between a respective address line and a logic circuit to generate a selection signal for a redundant memory cell in response to a predetermined address on the address lines. A pump-up circuit generates a pump-up voltage from a power supply voltage, wherein the pump-up voltage is greater than the power supply voltage. The pump-up voltage is applied to the gates of the field effect transistors to activate the redundancy circuit. According to another aspect, a redundancy circuit for an integrated circuit memory device comprises a repair controlling circuit that includes a repair fuse and that generates a repair control signal in response to opening of the repair control fuse. The enable controlling circuit is responsive to the repair controlling circuit and includes an enable fuse to generate a redundant enable signal in response to the repair control signal and opening of the enable fuse. A redundancy signal generator is responsive to the enable controlling circuit to generate a selection signal for a redundant memory cell in response to receipt of an address of a defective memory cell.

17 Claims, 5 Drawing Sheets

REDUNDANCY CIRCUITS FOR INTEGRATED CIRCUIT MEMORY DEVICES INCLUDING REPAIR CONTROLLING CIRCUITS AND ENABLE CONTROLLING CIRCUITS

FIELD OF THE INVENTION

This invention relates to integrated circuit memory devices and more particularly to redundancy circuits for integrated circuit memory devices.

BACKGROUND OF THE INVENTION

As the integration density of integrated circuit memory devices increases, redundancy systems may be used to increase device yields. In general, redundancy systems provide spare rows and/or spare columns of memory cells, and redundancy circuits for activating a spare row and/or column of memory cells. Accordingly, when an address signal specifying a memory cell of a defective row or a defective column is input, a spare row or column memory cell, rather than a normal memory cell, is selected by the input address. Redundancy systems are described, for example, in U.S. Pat. Nos. 5,742,547 to Lee, entitled"Circuits for Block Redundancy Repair of Integrated Circuit Memory Devices;" 5,761,138 to Lee et al., entitled "Memory Devices Having A Flexible Redundant Block Architecture" and 5,777,931 to Kwon et al., entitled "Synchronized Redundancy Decoding Systems and Methods for Integrated Circuit Memory Devices," all of which are assigned to the assignee of the present application, the disclosures of all of which are hereby incorporated herein by reference.

FIG. 1 is a block diagram of a conventional redundancy circuit. Referring to FIG. 1, a plurality of unit redundancy circuits $11_{13}1$, $11_{13}2$, $11_{13}3$, . . . control the respective redundant memory cell arrays. The unit redundancy circuits $11_{13}1$, $11_{13}2$, $11_{13}3$, . . . are enabled by a power-up signal PWUP that is activated when power is supplied to the integrated circuit memory device and activate redundant signals REDL1, REDL2, REDL3, . . . for selecting addresses and the cells of the corresponding redundant memory cell arrays. A power supply voltage VCC is supplied to the respective redundancy circuits.

FIG. 2 shows an embodiment of a unit redundancy circuit of FIG. 1. Referring to FIG. 2, a drain terminal N24 of an NMOS transistor 23 becomes a low level by turning on the NMOS transistor 23 in response to the power-up signal PWUP which is a pulse signal activated to a high level when the power is supplied to the integrated circuit memory device. The drain node N24 of the NMOS transistor 23 is inverted by an inverter 27.

A conventional redundancy circuit as shown in FIG. 2 includes a plurality of transfer means $29_{13}1$, $29_{13}2$, . . . for transferring address signals A0, A1, . . . and inverted address signals /A0, /A1, . . . . The transfer means $29_{13}1$, $29_{13}2$, . . . may be embodied as transfer gates in order to transfer address signals and inverted address signals without undue delay. A transfer gate generally includes at least one NMOS transistor (Ni, i=1, 2, . . .) and one PMOS transistor (Pi, i=1, 2, . . .). The PMOS transistor Pi is gated by a signal from the drain node N24 of the NMOS transistor 23. The NMOS transistor Ni is gated by the output node N28 of the inverter 27.

Unfortunately, the transfer means $29_{13}1$, $29_{13}2$, . . . realized by the PMOS transistor and the NMOS transistor of FIG. 2 may increase the layout area of the redundancy circuits in the integrated circuit memory device. Specifically, as the size of the memory device increases, the number of address signals also may increase. If the number of addresses for selecting the redundant memory cell of the redundant memory cell array is j, 4j MOS transistors may be used for transferring j address signals and j inverted address signals. Therefore, the MOS transistors and buses for gating the MOS transistors may increase in FIG. 2, thus increasing the layout area of the redundancy circuits in the integrated circuit memory device.

It is also known to provide redundancy circuits that do not require the use of transfer gates. See, for example, the above cited U.S. Pat. No. 5,777,931. Notwithstanding these advances, there continues to be a need for improved integrated circuit memory device redundancy circuits.

SUMMARY OF THE INVENTION

The present invention provides integrated circuit memory device redundancy circuits that include a plurality of field effect transistors and fuses, respective field effect transistor and a respective fuse being serially coupled between a respective address line and a logic circuit to generate a selection signal for a redundant memory cell in response to a predetermined address on the address lines. A pump-up circuit generates a pump-up voltage from a power supply voltage, wherein the pump-up voltage is greater than the power supply voltage. The pump-up voltage is applied to the gates of the field effect transistors to activate the redundancy circuit. Complementary transfer gates therefore are not needed, and the layout of the integrated circuit may be reduced.

The redundancy circuits preferably also include a plurality of second field effect transistors, wherein a respective (first) field effect transistor, a respective fuse and a respective second field effect transistor are serially coupled between a respective address line and ground voltage. The pump-up voltage is applied to the gates of the second plurality of field effect transistors to deactivate the redundancy circuit. An inverter may also be provided that is powered by the pump-up voltage. The inverter output is coupled to the gates of the first field effect transistors and the inverter input is coupled to the gates of the second field effect transistors.

An enable controlling circuit also may be provided that is coupled to the inverter input and that is responsive to a repair control signal. The enable controlling circuit preferably comprises a first fuse, a field effect transistor and a second fuse that are serially coupled between the pump-up voltage and ground voltage. The gate of the third field effect transistor is coupled to the repair control signal.

According to another aspect of the present invention, a redundancy circuit for an integrated circuit memory device comprises a repair controlling circuit that includes a repair fuse and that generates a repair control signal in response to opening of the repair fuse. The enable controlling circuit is responsive to the repair controlling circuit and includes an enable fuse to generate a redundant enable signal in response to the repair control signal and opening of the enable fuse. A redundancy signal generator is responsive to the enable controlling circuit to generate a selection signal for a redundant memory cell in response to receipt of an address of a defective memory cell.

More specifically, the enable controlling circuit includes the enable fuse, a field effect transistor and a stabilizing fuse that are serially coupled between first and second reference voltages. The repair control signal is coupled to the gate of the field effect transistor. The enable fuse and the field effect transistor define a node therebetween that is coupled to the redundancy signal generator, such that the redundancy signal generator is deactivated by the enable controlling circuit in response to opening of the stabilizing fuse. The redundancy signal generator preferably comprises the field effect transistors, fuses and pump-up circuit as described above. Accordingly, improved redundancy circuits may be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 1:
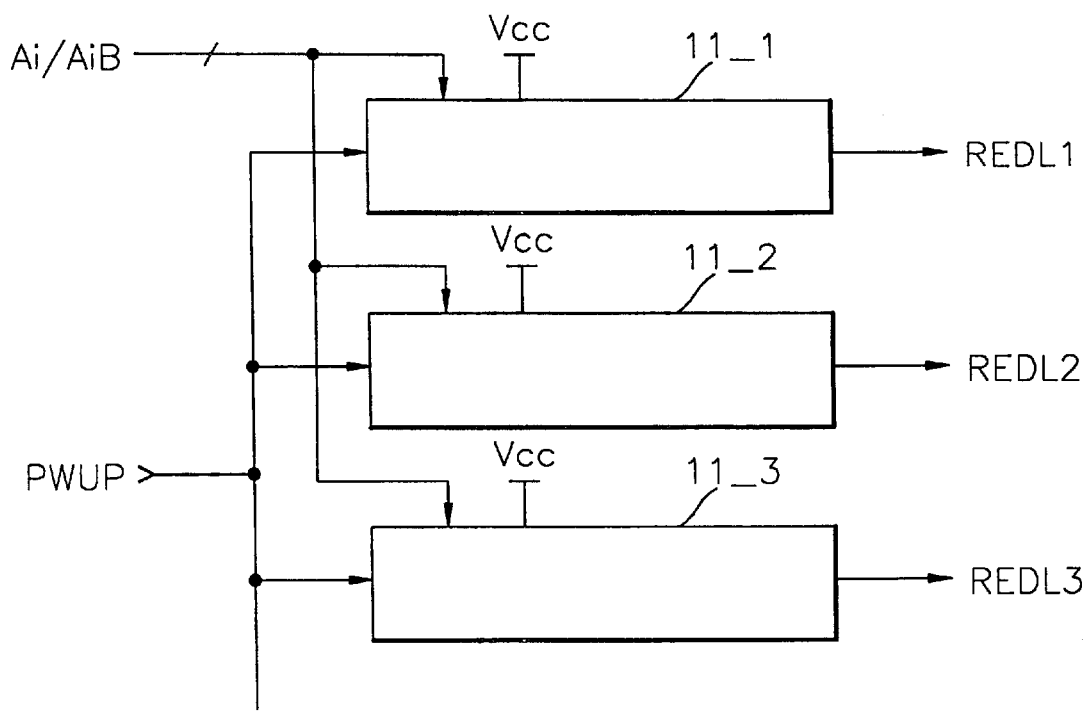
FIG. 1 is a block diagram of a conventional redundancy circuit.
Figure 2:
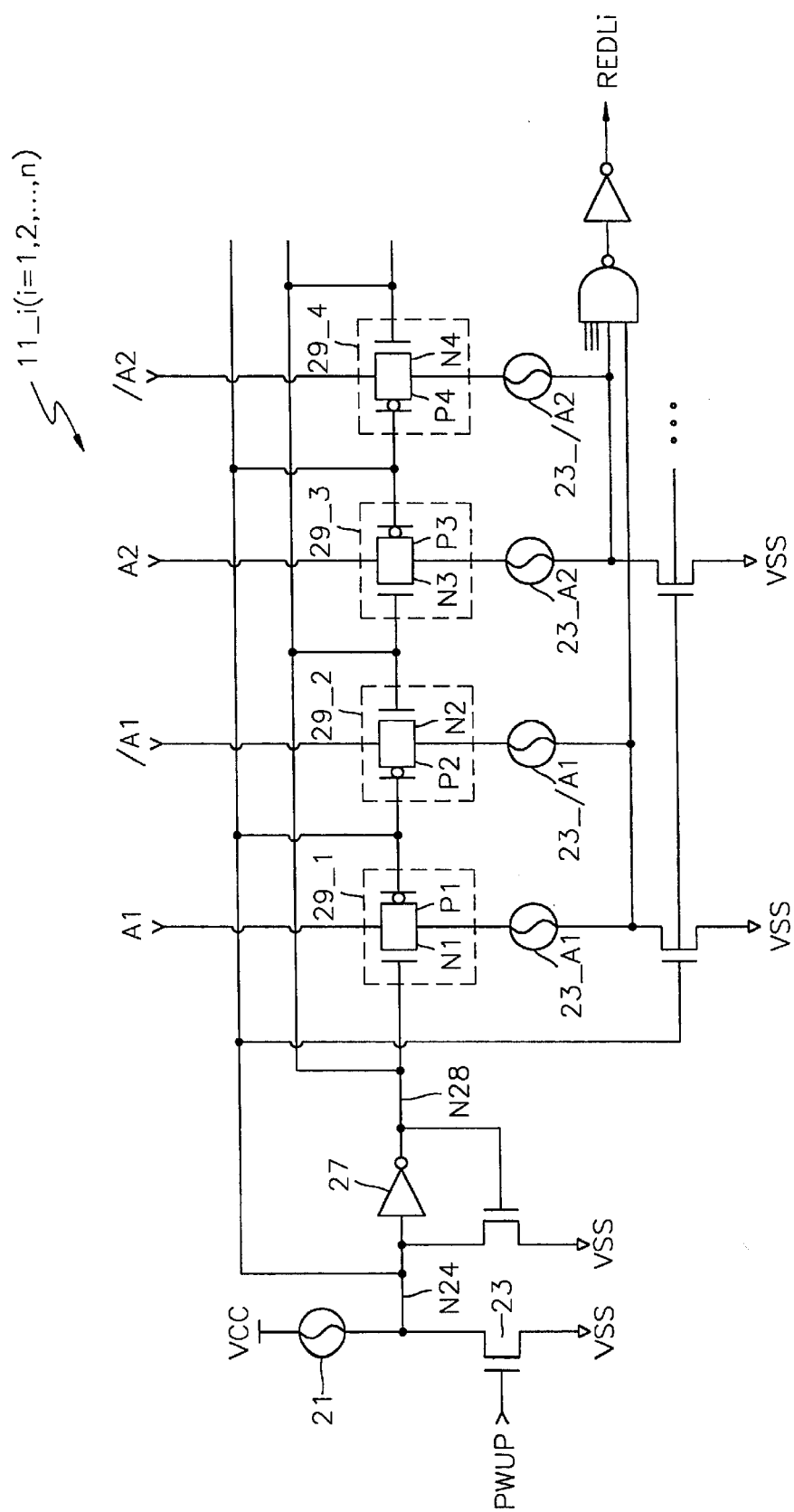
FIG. 2 is a circuit diagram of an embodiment of a unit redundancy circuit of FIG. 1.
Figure 3:
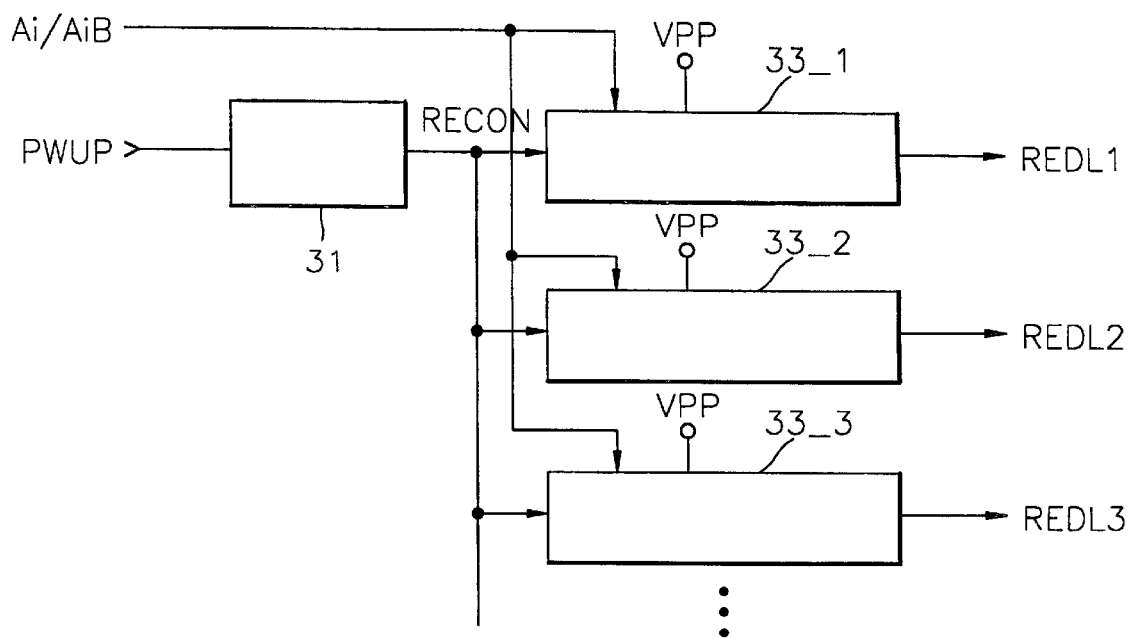
FIG. 3 is a block diagram of redundancy circuits according to the present invention.

FIG. 3 is a block diagram of redundancy circuits according to the present invention. A redundancy circuit according to the present invention can operate in an integrated circuit memory device having normal memory cells for storing data and redundant memory cells for repairing defective cells in the normal memory cells. Integrated circuit memory devices that replace defective memory cells with redundant memory cells are well known to those having skill in the art and need not be described further herein.

According to one embodiment of the invention, m normal memory cell arrays and n redundant memory cell arrays are included. The cells of the redundant memory cell array are decoded by j addresses.

Referring now to FIG. 3, a redundancy circuit according to the present invention includes a repair controlling circuit 31 and n unit redundancy circuits ($33_{13}$i,i=1,2,3, . . . ,n).

When a defect generated in a cell of the normal memory cell array of the integrated circuit memory device is repaired, the repair controlling circuit 31 generates a repair control signal RECON that is activated in response to a power-up signal PWUP. The power-up signal PWUP is driven by a signal or a pulse that is activated to a high level when power is applied to the integrated circuit memory device.

The unit redundancy circuits ($33_{13}$i,i=1,2,3, . . . ,n) are enabled by the activation of the repair control signal RECON. Namely, the plurality of unit redundancy circuits ($33_{13}$i,i=1,2,3, . . . ,n) are controlled by the repair control signal RECON.

When the complementary address signals Ai and AiB of a defective cell of the normal memory cell array are received by the unit redundancy circuits ($33_{13}$i,i=1, 2, 3, . . . ,n), a respective redundant signal (REDLi, i=1, 2, 3, . . . ,n) for selecting the cells of the redundant memory cell array, is activated.

Figure 4:
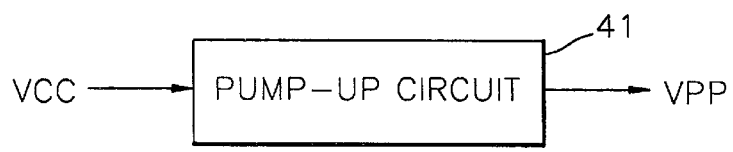
FIG. 4 is a block diagram of a pump-up circuit.

FIG. 4 shows a pump-up circuit 41 that generates a pump-up voltage, also referred to as a step-up voltage, VPP that is greater than the power supply voltage VCC. The pump-up voltage VPP is applied to the unit redundancy circuits ($33_{13}$i,i=1,2,3, . . . ,n), as will be described in detail below.

Figure 5:
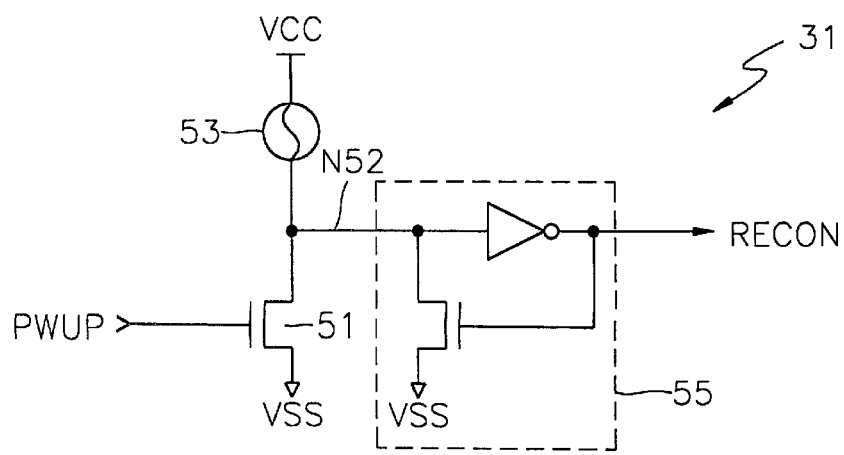
FIG. 5 is a circuit diagram of a repair controlling circuit of FIG. 3.

FIG. 5 shows a repair controlling circuit of FIG. 3. Referring to FIG. 5, the repair controlling circuit 31 includes an NMOS transistor 51, a repair fuse 53 and a latch circuit 55.

The NMOS transistor 51 is turned on in response to the power-up signal PWUP. A source terminal is connected to ground voltage VSS. The conductance of the NMOS transistor 51 is lower than that of the repair fuse 53. The repair fuse 53 supplies the power supply voltage VCC to a drain terminal N52 of the NMOS transistor 51 and can be opened. The latch portion 55 inverts and latches the signal of the drain terminal N52 of the NMOS transistor 51, and generates the repair control signal RECON.

When there is no defective cell in the integrated circuit memory device, the repair fuse 53 is not opened. Therefore, even if power is supplied to the integrated circuit memory device and the power-up signal PWUP is activated to the high level, the voltage level of the drain terminal N52 of the NMOS transistor 51 maintains a high level. Thus, the repair control signal RECON is not activated.

However, when there are defective cells in the integrated circuit memory device, the repair fuse 53 is opened, for example by cutting. Therefore, when power is supplied to the integrated circuit memory device and the power-up signal PWUP is activated to the high level, the voltage level of the drain terminal N52 of the NMOS transistor 51 becomes low. Thus, the repair control signal RECON is activated to the high level.

Figure 6:
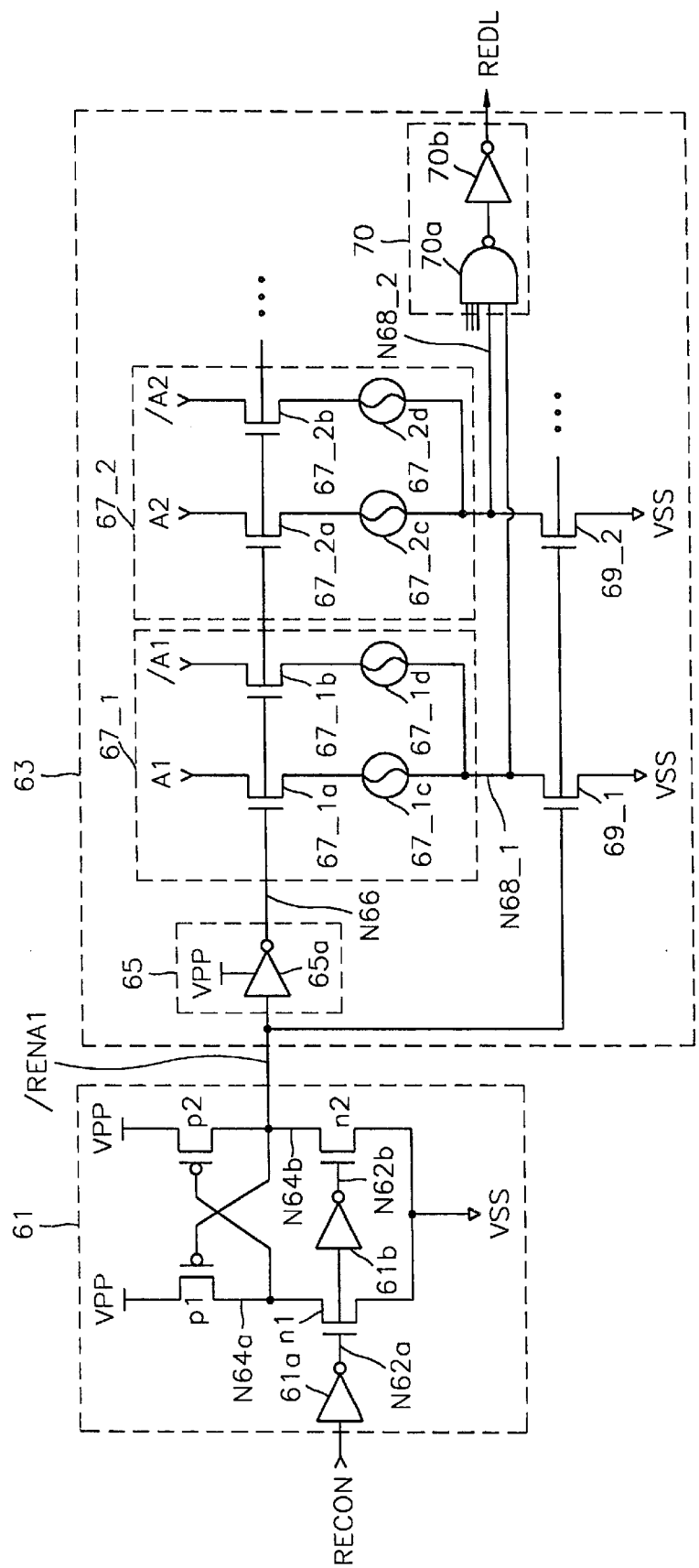
FIG. 6 is a circuit diagram of a unit redundancy circuit according to a first embodiment of the present invention.
Figure 7:
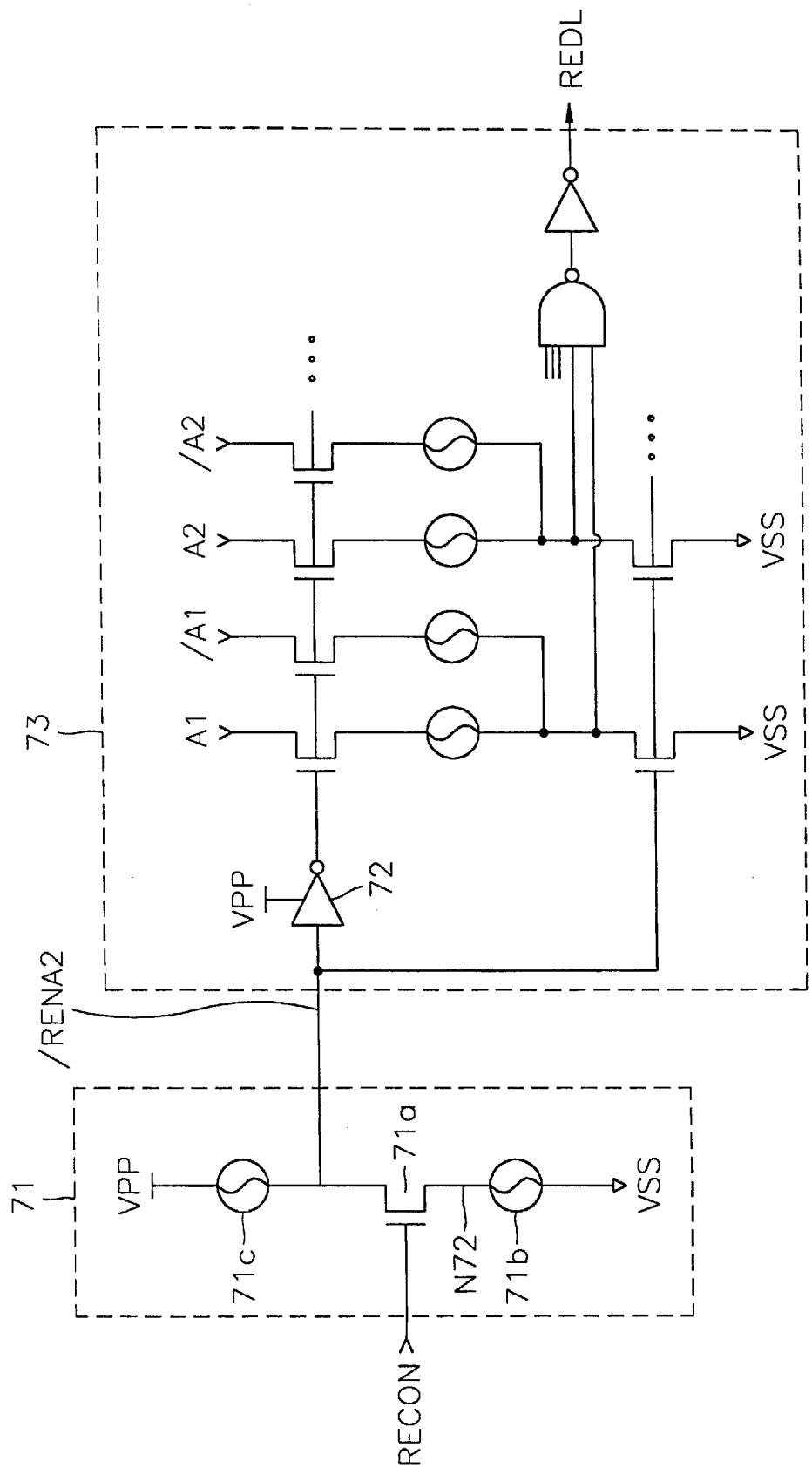
FIG. 7 is a circuit diagram of a unit redundancy circuit according to a second embodiment of the present invention.

FIG. 6 illustrates a first embodiment of a unit redundancy circuit of FIG. 3. FIG. 7 illustrates a second embodiment of a unit redundancy circuit of FIG. 3. The unit redundancy circuit of the first embodiment of FIG. 6 and the unit redundancy circuit of the second embodiment of FIG. 7 respectively include enable controlling circuits 61 and 71 and redundant circuits 63 and 73, also referred to herein as "redundancy signal generators".

Referring to FIG. 6, the enable controlling circuit 61 of the first embodiment has a latch structure comprising two NMOS transistors n1 and n2 and two PMOS transistors p1 and p2. An output signal N62a of an inverter 61a for inverting the repair control signal RECON is applied to the gate terminal of the NMOS transistor n1. The source terminal of the NMOS transistor n1 is coupled to ground voltage VSS. An output signal N62b of an inverter 61b which inverts the output signal N62a of the inverter 61a is applied to the gate terminal of the NMOS transistor n2. The source terminal of the NMOS transistor n2 is coupled to ground voltage VSS.

In the PMOS transistor p1, a first source/drain region is coupled to the pump-up voltage VPP, a second source/drain region is coupled to a first source/drain region N64a of the NMOS transistor n1, and a gate is coupled to a first source/drain region N64b of the NMOS transistor n2. In the PMOS transistor p2, a first source/drain region is coupled to pump-up voltage VPP, a second source/drain region is coupled to the first source/drain region N64b of the NMOS transistor n2, and a gate is coupled to the first source/drain region N64a of the NMOS transistor n1. The signal of the first source/drain region N64b of the NMOS transistor n2 and the second source/drain region of PMOS transistor p2 defines a redundant enable signal /RENA1 which is the output signal of the enable controlling circuit 61 and controls the redundant circuit 63.

Therefore, when the integrated circuit memory device is in a repair mode and the repair control signal RECON is activated to the high level, the NMOS transistor n1 is turned off and the NMOS transistor n2 is turned on. Therefore, the voltage of the drain terminal N64b of the NMOS transistor n2 is lowered and the PMOS transistor p1 is turned on. The voltage of the first source/drain region N64a of the PMOS transistor p1 is raised, thus turning off the PMOS transistor p2. Therefore, the redundant enable signal /RENA1 is activated to a low level. The redundant circuit 63 is enabled.

The redundant circuit 63 is enabled by the activation of the redundant enable signal RENA1 and generates a redundant signal REDLi that is activated when the addresses of the defective cells are received, for selecting a memory cell of the redundant memory cell array. The redundant signal REDLi represents signals REDL1, REDL2, ..., REDLn of FIG. 3 for selecting the cells of the redundant memory cell arrays.

The redundant circuit 63 is comprised of a driving portion 65, switching portions ($67_{13}i, i=1,2,3,\ldots,j$), disable NMOS transistors ($69_{13}i, i=1,2,3,\ldots,j$), and a logic circuit 70.

The driving portions 65 outputs the pump-up voltage VPP in response to the activation of the redundant enable signal RENA1. Preferably, the driving portion 65 includes an inverter 65a connected to the pump-up voltage VPP. Therefore, an output node N66 of the driving portion 65 generates the pump-up voltage VPP or the ground voltage VSS.

The switching portions ($67_{13}i, i=1,2,3,\ldots,j$) are gated by the output signal on node N66 of the driving portion 65. The switching portions ($67_{13}i, i=1,2,3,\ldots,j$) transfer corresponding address signals ($Ai, i=1,2,3,\ldots,j$) and inverted address signals ($/Ai, i=1,2,3,\ldots,j$). For example, the switching portion $67_{13}1$ transfers the corresponding address signal A1 and the inverted address signal /A1.

In the disable NMOS transistors ($69_{13}i, i=1,2,3,\ldots,j$), the redundant enable signal /RENA1 is applied to the gate, the ground voltage VSS is connected to a first source/drain region, and outputs ($N68_{13}i, i=1,2,3,\ldots,j$) of the switching portions ($67_{13}i, i=1,2,3,\ldots,j$) are connected to a second source/drain region.

The logic circuit 70 comprises a NAND gate 70a and an inverter 70b. The logic circuit 70 performs an AND operation on the signals of the outputs ($N68_{13}i, i=1,2,3,\ldots,j$) of the j switching portions and generates the redundant enable signal REDLi.

The structure and operation of the switching portions ($67_{13}i, i=1,2,3,\ldots,j$) are as follows, taking the switching portion $67_{13}1$ as an example. The switching portion $67_{13}1$ includes first and second NMOS transistors $67_{13}1a$ and $67_{13}1b$ and first and second transfer fuses $67_{13}1c$ and $67_{13}1d$.

The first NMOS transistor $67_{13}1a$ is gated by the output signal on node N66 of the driving portion 65 and transfers an address signal A1. Namely, when the repair control signal RECON is activated to the high level, the output signal on node N66 of the driving portion 65 is activated to the pump-up voltage VPP. The first NMOS transistor $67_{13}1a$ is turned on and transfers the address signal A1. At this time, since the output signal on node N66 of the driving portion 65 is activated to the pump-up voltage VPP, the first NMOS transistor $67_{13}1a$ can transfer the address signal A1 at a high level without loss of data.

The second NMOS transistor $67_{13}1b$ is gated by the output signal on node N66 of the driving portion 65 and transfers an inverted address signal /A1. The second NMOS transistor $67_{13}1b$ can transfer the inverted address signal /A1 at a high level without loss of data, like the first NMOS transistor $67_{13}1a$.

The first transfer fuse $67_{13}1c$ transfers the address signal A1 that is transferred by the first transfer transistor $67_{13}1a$ to the output $N68_{13}1$ of the switching portion $67_{13}1$. The second transfer fuse $67_{13}1d$ transfers the inverted address signal /A1 that is transferred by the second transfer transistor $67_{13}1b$ to the output $N68_{13}1$ of the switching portion $67_{13}1$. The output $N68_{13}1$ of the switching portion $67_{13}1$ is connected to the second source/drain region of the disable NMOS transistor $69_{13}1$ and is connected to one input of the NAND gate 70a.

Operation of a redundancy circuit according to the present invention will now be described. When the defective cells existing in the normal memory cell array are repaired, the repair fuse 53 (refer to FIG. 5) is cut or otherwise opened. In the redundant circuit 63, the remaining fuses, excluding the fuses corresponding to the addresses of the cells to be repaired, are cut. For example, when the address of A1 and the address of A2 respectively repair the cells corresponding to high and low, the fuses ($67_{13}1d$, $67_{13}2c$, ...) are cut.

When the fuses are cut as described above, the repair control signal RECON is activated to the high level when power is supplied to the integrated circuit memory device. The redundant enable signal /RENA1 is activated to the low level. The output signal on node N66 of the driving portion 65 is activated to the high level. Therefore, the disable NMOS transistors $69_{13}i, i=1,2,3,\ldots,j$) are turned off by the activation to the low level of the redundant enable signal /RENA1. The NMOS transistors $67_{13}1a$, $67_{13}1b$, $67_{13}2a$, and $67_{13}2b$, ... are turned on.

When the address of the cell to be repaired is received by the redundant circuit 63, the signals of the input of the NAND gate 70a become high level. The redundant enable signal REDLi is activated to the high level.

According to the first embodiment of the unit redundancy circuit of the present invention, the address signals A1, A2, ... and the inverted address signals /A1, /A2, ... are transferred to the NMOS transistors $67_{13}1a$, $67_{13}1b$, $67_{13}2a$, $67_{13}2b$, .... Therefore, 2j MOS transistors may be used for transferring j address signals and j inverted address signals. Since up to 4j MOS transistors may be used in some conventional redundancy circuits, up to 2j MOS transistors may be eliminated. When 13 address signals are used up to 26 MOS transistors and buses may be eliminated. Therefore, the layout area for construction of the redundancy circuit may be reduced compared to conventional redundancy circuits that use up to 4j MOS transistors.

However, two inverters and four MOS transistors are used for the enable controlling circuit 61 of the first embodiment in a latch structure. Moreover, leakage current may be generated from the pump-up voltage VPP to the ground voltage VSS. In the second embodiment of FIG. 7, the layout area may be reduced compared to the enable controlling circuit 61 of the first embodiment of FIG. 6.

Referring to FIG. 7, a redundancy circuit of the second embodiment includes an enable controlling circuit 71 and a redundant circuit 73 also referred to as a "redundancy signal generator". The enable controlling circuit 71 is enabled by cutting an enable fuse 71c and generates a redundant enable signal /RENA2 activated in response to the repair control signal RECON for indicating that the integrated circuit memory device is in a repair mode.

The enable controlling circuit 71 includes a MOS transistor 71a, a stabilizing fuse 71b, and an enable fuse 71c. The MOS transistor 71a is an NMOS transistor that is turned on by the activation of the repair control signal RECON to the high level. The stabilizing fuse 71b supplies the ground voltage VSS to a first source/drain region N72 of the MOS transistor 71a and can be cut. The enable fuse 71c supplies the pump-up voltage VPP to the second source/drain region of the MOS transistor 71a and can be cut. The signal of the second source/drain region of the MOS transistor 71a is the redundant enable signal /RENA2 which is the output signal of the enable controlling circuit 71.

When there is no defective cell in the corresponding normal memory cell array, the stabilizing fuse 71b is opened. When the stabilizing fuse 71b is opened, the redundant enable signal /RENA2 is inactivated to the high level.

When there are defective cells in the corresponding normal memory cell array, the enable fuse 71c is opened. When the enable fuse 71c is opened and the repair control signal RECON is activated to the high level, the redundant enable signal /RENA2 is activated to the low level. The redundant circuit 73 is enabled in response to the activation of the redundant enable signal /RENA2.

Since the structure and operation effect of the redundant circuit 73 are the same as those of the redundant circuit 63 of FIG. 6 of the first embodiment, a description thereof will not be repeated.

Referring to FIG. 7, the enable controlling circuit 71 of the second embodiment is comprised of a MOS transistor 71a and two fuses 71b and 71c. Therefore, the layout area of the enable controlling circuit 71 can be less than that of the enable controlling circuit 61. In the enable controlling circuit 71 of the second embodiment, little leakage current may be generated since a current path is not provided between the pump-up voltage VPP and the ground voltage VSS during the operation.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A redundancy circuit for an integrated circuit memory device, comprising:
    a plurality of field effect transistors and fuses, a respective field effect transistor and a respective fuse being serially coupled between a respective address line and a logic circuit to generate a selection signal for a redundant memory cell in response to a predetermined address on the address lines; and
    a pump-up circuit that generates a pump-up voltage from a power supply voltage, wherein the pump-up voltage is greater than the power supply voltage;
    wherein the pump-up voltage is applied to the gates of the field effect transistors to activate the redundancy circuit.

2. A redundancy circuit according to claim 1 wherein the plurality of field effect transistors is a plurality of first field effect transistors, the redundancy circuit further comprising:
    a plurality of second field effect transistors, a respective first field effect transistor, a respective fuse and a respective second field effect transistor being serially coupled between a respective address line and ground voltage, wherein the pump-up voltage is applied to the gates of the second plurality of field effect transistors to deactivate the redundancy circuit.

3. A redundancy circuit according to claim 2 further comprising an inverter that is powered by the pump-up voltage, the inverter including an input and an output, the inverter output being coupled to the gates of the first field effect transistors and the inverter input being coupled to the gates of the second field effect transistors.

4. A redundancy circuit according to claim 3 further comprising an enable controlling circuit that is coupled to the inverter input and that is responsive to a repair control signal.

5. A redundancy circuit according to claim 4 wherein the enable controlling circuit comprises a first fuse, a third field effect transistor and a second fuse that are serially coupled between the pump-up voltage and ground voltage, the gate of the third field effect transistor being coupled to the repair control signal.

6. A redundancy circuit for an integrated circuit memory device, comprising:
    a repair controlling circuit that includes a repair fuse and that generates a repair control signal in response to opening of the repair control fuse;
    an enable controlling circuit that is responsive to the repair controlling circuit and that includes an enable fuse to generate a redundant enable signal in response to the repair control signal and opening of the enable fuse; and
    a redundancy signal generator that is responsive to the enable controlling circuit to generate a selection signal for a redundant memory cell in response to receipt of an address of a defective memory cell.

7. A redundancy circuit according to claim 6 wherein the enable controlling circuit comprises:
    the enable fuse, a field effect transistor and a stabilizing fuse that are serially coupled between first and second reference voltages, the repair control signal being coupled to the gate of the field effect transistor, wherein the enable fuse and the field effect transistor define a node therebetween that is coupled to the redundancy signal generator, such that the redundancy signal generator is deactivated by the enable controlling circuit in response to opening of the stabilizing fuse.

8. A redundancy circuit according to claim 7 wherein the redundancy signal generator comprises:
    a plurality of field effect transistors and fuses, a respective field effect transistor and a respective fuse being serially coupled between a respective address line and a logic circuit to generate the selection signal for a redundant memory cell in response to a predetermined address on the address lines; and
    a pump-up circuit that generates a pump-up voltage from a power supply voltage, wherein the pump-up voltage is greater than the power supply voltage;
    wherein the pump-up voltage is applied to the gates of the field effect transistors to activate the redundancy circuit.

9. A redundancy circuit according to claim 8 wherein the plurality of field effect transistors is a plurality of first field effect transistors, the redundancy circuit further comprising:

a plurality of second field effect transistors, a respective first field effect transistor, a respective fuse and a respective second field effect transistor being serially coupled between a respective address line and ground voltage, wherein the pump-up voltage is applied to the gates of the second plurality of field effect transistors to deactivate the redundancy circuit.

10. A redundancy circuit according to claim 9 further comprising an inverter that is powered by the pump-up voltage, the inverter including an input and an output, the inverter output being coupled to the gates of the first field effect transistor and the inverter input being coupled to the gates of the second field effect transistors.

11. A unit redundancy circuit of an integrated circuit memory device for controlling redundant memory cell arrays of an integrated circuit memory device comprising:
   an enable controlling circuit disabled by cutting a stabilizing fuse for generating a redundant enable signal enabled in response to the cutting of an enable fuse and a repair control signal for instructing that the integrated circuit memory device is in a repair mode; and
   a redundant circuit enabled by the activation of the redundant enable signal for generating a redundant signal activated when the addresses of the defective cells are received for selecting the memory cell of the redundant memory cell array.

12. The unit redundancy circuit of claim 11, wherein the integrated circuit memory device includes a pump-up circuit for generating a pump-up voltage by pumping up a power supply voltage, and wherein the enable controlling circuit comprises:
   a MOS transistor gated by the activation of the repair control signal;
   a stabilizing fuse which can be cut, for electrically connecting a first source/drain region of the MOS transistor to a ground voltage; and
   an enable fuse which can be cut, for electrically connecting a second source/drain region of the MOS transistor to the pump-up voltage for generating the redundant enable signal.

13. The unit redundancy circuit of claim 11, wherein the redundant circuit comprises:
   a driving portion for outputting the pump-up voltage in response to the activation of the redundant enable signal;
   a plurality of switching portions gated by the output signal of the driving portion, for transferring corresponding address signals and the inverted signal of the address signal;
   a corresponding plurality of disable NMOS transistors gated by the non-activation of the redundant enable signal, to which the ground voltage is supplied through a first source/drain region, and connecting the outputs of the switching portions through a second source/drain region; and
   a logic circuit that performs logic operations on the signals of the respective output ports of the plurality of switching portions and generates the redundant enable signal;
   wherein each of the switching portions comprise:
   first and second NMOS transistors gated by the output signal of the driving portion, for transferring corresponding address signals and the inverted signal of the address signals; and
   first and second transfer fuses which can be cut, for transferring the transfer signals of the first and second transfer transistors to the output port of the switching portion.

14. A redundancy circuit of an integrated circuit memory device for controlling redundant memory cell arrays of an integrated circuit memory device having normal memory cell arrays for storing data, comprising:
   a repair controlling circuit for generating a repair control signal activated in response to the power supply of the integrated circuit memory device when the integrated circuit memory device performs repairing;
   a plurality of unit redundancy circuits, enabled by the cutting of an enable fuse and the activation of the repair control signal and disabled by the cutting of a stabilizing fuse, for generating the respective redundant signals for selecting the cells of the redundant memory cell array by receiving the address of a defective cell of the normal memory cell array; and
   a pump-up circuit for generating a pump-up voltage by pumping up a power supply voltage;
   wherein the unit redundancy circuits comprise:
   an NMOS transistor for receiving the address; and
   an inverter for driving the NMOS transistor by the pump-up voltage.

15. The redundancy circuit of claim 14, wherein the respective unit redundancy circuits comprise:
   an enable controlling circuit enabled by the cutting of the enable fuse, for generating a redundant enable signal activated in response to the repair control signal; and
   a redundant circuit enabled by the activation of the redundant enable signal, for generating the redundant signal activated when the address of the defective cell is received.

16. The redundancy circuit of claim 15, wherein the enable controlling circuit comprises:
   a MOS transistor gated by the activation of the repair control signal;
   a stabilizing fuse which can be cut, for electrically connecting a first source/drain region of the MOS transistor to a ground voltage; and
   an enable fuse which can be cut, for electrically connecting a second source/drain region of the MOS transistor to the pump-up voltage for generating the redundant enable signal to the pump-up voltage.

17. The redundancy circuit of claim 14, wherein the repair controlling circuit comprises:
   an NMOS transistor turned on in response to the power supply of the integrated circuit memory device and the first source/drain region of which is connected to a ground voltage;
   a repair fuse which can be cut, for supplying the power voltage to the second source/drain region of the NMOS transistor; and
   a latch portion for inverting and latching the voltage level of the second source/drain region of the NMOS transistor and generating the repair control signal when the integrated circuit memory device performs repairing.

* * * * *